United States Patent
Kemppinen et al.

(10) Patent No.: US 11,981,204 B2
(45) Date of Patent: May 14, 2024

(54) VEHICLE OPERATING UNIT WITH TACTILE FEEDBACK

(71) Applicant: BEHR-HELLA THERMOCONTROL GMBH, Lippstadt (DE)

(72) Inventors: Pasi Kemppinen, Tampere (FI); Stefan Kirsch, Soest (DE)

(73) Assignee: BEHR-HELLA THERMOCONTROL GMBH, Lippstadt (DE)

( * ) Notice: Subject to any disclaimer, the term of this patent is extended or adjusted under 35 U.S.C. 154(b) by 569 days.

(21) Appl. No.: 17/272,386

(22) PCT Filed: Sep. 4, 2019

(86) PCT No.: PCT/EP2019/073550
§ 371 (c)(1),
(2) Date: Mar. 1, 2021

(87) PCT Pub. No.: WO2020/049028
PCT Pub. Date: Mar. 12, 2020

(65) Prior Publication Data
US 2021/0323408 A1  Oct. 21, 2021

(30) Foreign Application Priority Data
Sep. 5, 2018 (DE) ...................... 10 2018 121 692.0

(51) Int. Cl.
| | |
|---|---|
| *B60K 35/00* | (2006.01) |
| *G06F 3/01* | (2006.01) |
| *H10N 30/88* | (2023.01) |
| *B60K 35/10* | (2024.01) |
| *B60K 35/25* | (2024.01) |

(52) U.S. Cl.
CPC .............. *B60K 35/00* (2013.01); *G06F 3/016* (2013.01); *H10N 30/88* (2023.02); *B60K 35/10* (2024.01);
(Continued)

(58) Field of Classification Search
CPC ............ B60K 35/00; B60K 2370/1438; B60K 2370/158; H10N 30/88; H10N 30/50; H10N 2/043; G06F 3/016
See application file for complete search history.

(56) References Cited

U.S. PATENT DOCUMENTS

| | | | |
|---|---|---|---|
| 3,819,963 | A | 6/1974 | Kondo et al. |
| 4,952,835 | A | 8/1990 | Stahlhuth |
| (Continued) | | | |

FOREIGN PATENT DOCUMENTS

| | | |
|---|---|---|
| DE | 23 05 277 B2 | 8/1973 |
| DE | 42 14 220 C2 | 4/1993 |
| (Continued) | | |

OTHER PUBLICATIONS

International Search Report and Written Opinion issued in International Application No. PCT/EP2019/073550 dated Feb. 14, 2020, with English translation.

*Primary Examiner* — Emily P Pham
(74) *Attorney, Agent, or Firm* — BakerHostetler

(57) ABSTRACT

The operating unit comprises an operating element which is adapted to be mechanically excited by means of a piezo driver. The piezo driver comprises a piezo actuator made from a piezoelectric material. The longitudinal extension ends of the piezo actuator have mechanically coupled thereto a conversion gear for converting a length change of the piezo actuator occurring in the effective direction of the piezo actuator into a movement of an element, which is coupled to the conversion gear and to be moved, at an angle not equal to 0 degree relative to the longitudinal extension of the piezo actuator. The conversion gear comprises a first bracket which is of an elastic configuration and/or comprises an elastic material and which, in the area of the longitudinal extension ends of the piezo actuator, is mechanically coupled to the latter. The first bracket is provided with a first (Continued)

Figure 1:
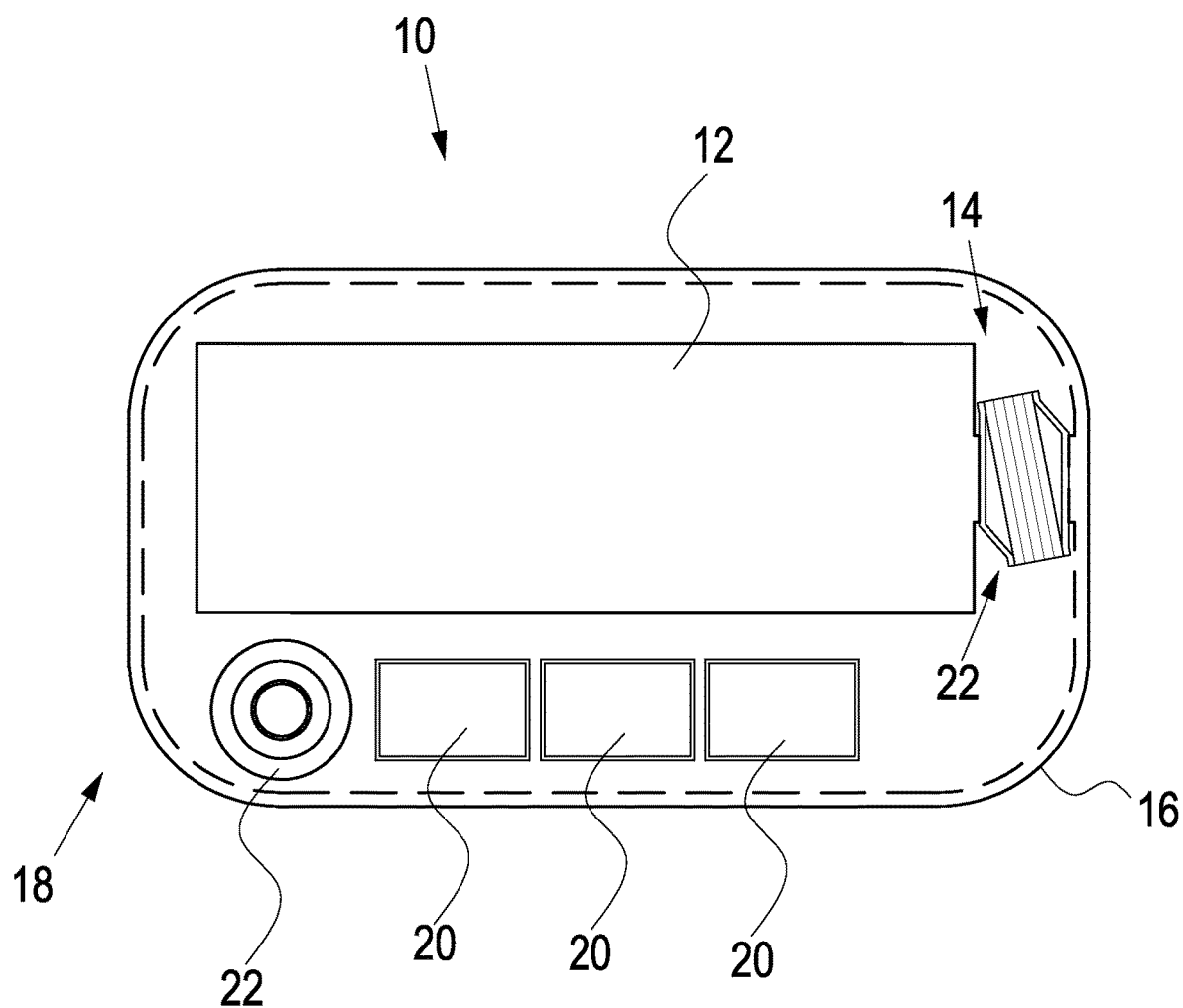

and a second end portion, where the first bracket is respectively mechanically coupled to the piezo actuator, and between the two end portions, is provided with an oblique first inclined portion and an oblique second inclined portion which is shorter as compared to the first inclined portion. These portions of the bracket extend like the sides of a triangle with an imaginary connecting line extending between the end portions of the bracket as a basis and are elastically connected to each other.

11 Claims, 2 Drawing Sheets

(52) U.S. Cl.
CPC ...... *B60K 35/25* (2024.01); *B60K 2360/1438* (2024.01)

(56) References Cited

U.S. PATENT DOCUMENTS

| | | |
|---|---|---|
| 6,246,132 B1 | 6/2001 | Joshi et al. |
| 6,273,681 B1 | 8/2001 | Yamakawa et al. |
| 6,427,897 B2 | 8/2002 | Wallaschek et al. |
| 6,465,936 B1 | 10/2002 | Knowles et al. |
| 8,502,433 B2 | 8/2013 | Zanella et al. |
| 9,523,294 B2 | 12/2016 | Cho |
| 2016/0027263 A1* | 1/2016 | Parker ................ H02N 2/043 340/407.1 |
| 2016/0037263 A1 | 2/2016 | Pal et al. |
| 2016/0060025 A1 | 3/2016 | Dunn et al. |
| 2019/0196597 A1 | 6/2019 | Rinner et al. |

FOREIGN PATENT DOCUMENTS

| | | |
|---|---|---|
| DE | 20 200 017 833 U1 | 9/2010 |
| DE | 199 81 030 B4 | 4/2015 |
| DE | 10 2016 116 763 A1 | 3/2018 |
| EP | 1 035 015 A2 | 9/2000 |
| EP | 3 056 977 A1 | 8/2016 |
| JP | S59-177980 U | 11/1984 |
| JP | 2008-287402 A | 11/2008 |
| WO | 2014/096565 A1 | 6/2014 |
| WO | 2014/164018 A1 | 10/2014 |
| WO | 216/067831 A1 | 5/2016 |

* cited by examiner

VEHICLE OPERATING UNIT WITH TACTILE FEEDBACK

CROSS REFERENCE

This application is the U.S. National Phase under 35 U.S.C. § 371 of International Application No. PCT/EP2019/073550 filed on Sep. 4, 2019, which claims the benefit of German Application No. 10 2018 121 692.0 filed on Sep. 5, 2018, the entire contents of each are hereby incorporated by reference.

The invention relates to a vehicle operating unit with tactile feedback upon manual actuation and having a piezo driver.

In piezo drivers the length changeability of a piezoelectric element in an effective direction during electrical driving is utilized for mechanically exciting a component or a unit to be moved. One application in the automobile industry is the use of a piezo driver for generating a haptic feedback at an operating device. Such an operating device comprises a touch screen or a touch pad which is excited for a short time or in a pulsed manner when a valid manual operation has been detected. Thus a haptic feedback is provided by means of which the operator is informed in a tactile manner of a valid operation. In particular, the invention relates to a piezo actuator having a gear, which, among experts, is also referred to as a piezo actuator with mechanical amplification.

The length changeability of piezo actuators or of piezo-electrically acting elements of such actuators is large enough for being tactilely perceived, which however is frequently inadequate in certain applications. For increasing the length change piezo actuators are used which comprise a plurality of stacked piezoelectric elements (hereinafter referred to as piezo elements). Such a piezo actuator mechanically acts upon a movement conversion structure or a corresponding conversion gear via which a length change of the piezo actuator in the effective direction performed at a comparatively large force is converted into a larger movement with a correspondingly smaller force.

The prior art conversion gears for piezo actuators comprise an essentially arcuate bracket which is in most cases adhesively connected to the piezo actuator at its ends lying in the effective direction of the piezo actuator. Two such brackets can be arranged on both sides of the effective axis extension of the piezo actuator. The brackets are made from a comparatively rigid material, such as metal, and are stretched or compressed when the piezo actuator is electrically driven, whereby a movement component is provided which is directed at an acute angle to the effective direction of the piezo actuator. The deformation of the bracket or the brackets can lead to fatigue of the bracket material over time, which may affect the functionality of the piezo driver.

Examples of piezo drivers having conversion gears are described in DE-U-20 2008 017 833, U.S. Pat. Nos. 6,246, 132, 4,952,835, WO-A-2017/1762019, U.S. Pat. No. 9,523, 294, EP-A-3 056 977, WO-A-2014/164018, WO-A-2016/067831, U.S. Pat. No. 6,465,936, WO-A-2014/096565, US 2016/0 027 263, DE-A-10 2016 116 763, JP-A-2008-287402, EP-A-1 035 015, DE-B-23 05 277, DE-C-42 14 220 and DE-B-199 81 030.

It is an object of the invention to provide an operating unit with tactile feedback upon manual actuation and having a piezo driver, which has a long service life and an improved functionality.

For achieving this object, the invention proposes a vehicle operating unit with tactile feedback upon manual actuation, comprising a housing, an operating element which is adapted to be manually actuated, and a piezo driver for pulsed mechanical excitation of the operating element, wherein the piezo driver is arranged between a housing wall of the housing and the operating element and provided with a piezo actuator made from a piezoelectric material, wherein the piezo actuator is of a strand-shaped configuration and has a longitudinal extension between two ends and wherein the longitudinal extension of the piezo actuator defines the effective direction of the latter along which the piezo actuator expands and/or contracts when being driven, and a conversion gear mechanically coupled to the longitudinal extension ends of the piezo actuator for converting a length change of the piezo actuator occurring in the effective direction of the piezo actuator into a movement of an element, which is coupled to the conversion gear and to be moved, at an angle not equal to 0 degree relative to the longitudinal extension of the piezo actuator, wherein the conversion gear comprises a first bracket which is of an elastic configuration and/or comprises an elastic material and, in the area of the longitudinal extension ends of the piezo actuator, is mechanically coupled to the latter, wherein the first bracket comprises a first and a second end portion, within which the first bracket is respectively mechanically coupled to the piezo actuator, and between the two end portions an oblique first inclined portion and an oblique second inclined portion, that is shorter as compared to the first inclined portion, which extend like the sides of a triangle with an imaginary connecting line extending between the end portions of the bracket as a basis and are connected to each other, in particular elastically connected to each other, and where the first inclined portion is connected, in particular elastically connected, to the first end portion and the second inclined portion is connected, in particular elastically connected, to the second end portion, and wherein the first bracket is coupled to the operating element and the piezo actuator is coupled to the housing wall, or the first bracket is coupled to the housing wall and the piezo actuator is coupled to the operating element.

The piezo driver of the operating unit according to the invention comprises, in a manner known per se, a piezo actuator made from a piezoelectric material. The piezo actuator expands and/or contracts along an effective direction when being driven by an electric voltage. At the ends of the strand-shaped piezo actuator, which lie in the effective direction, the latter is operatively connected to a conversion gear. This conversion gear amplifies the degree of expansion or contraction of the piezo actuator into a movement with a larger stroke along a movement axis which extends at an acute angle to the effective direction of the piezo actuator.

The particular feature of the piezo driver of the operating unit according to the invention is the configuration of the at least one bracket of the conversion gear. This first bracket comprises two opposite end portions between which the bracket comprises two oblique first and second inclined portions. The two inclined portions are connected to each other, wherein their respective ends opposite the interconnected ends are respectively connected to another one of the two end portions. Thus the first bracket is triangular as seen in a side view, wherein the inclined portions are the sides of a triangle whose basis is formed by an imaginary connecting line between the two end portions.

One of the two inclined portions, namely the first inclined portion, is longer than the other inclined portion, i.e. longer than the second inclined portion.

The two inclined portions provided according to the invention cause a particular efficient conversion of the length change of the piezo actuator in its effective direction into a movement of an element to be moved performed at an acute angle to the longitudinal extension of the piezo actuator. The bracket of the conversion gear of the piezo driver merely comprises three flexible zones in which the bracket experiences a material deformation when the piezo actuator is electrically driven. This reduced number of material deformation zones enables the piezo driver to remain functional over a longer time. Thus the robustness of the piezo driver increases with comparably less material required and at lower production expenditure.

According to another advantageous embodiment of the invention it is provided that the first inclined portion of the first bracket is adapted to be mechanically operatively connected to an element to be moved and that the piezo actuator is adapted to be supported on a supporting element. The mechanical coupling of the first bracket to the element to be moved in the area of the first inclined portion reduces tilts of the element occurring when the first bracket is moved. The first inclined portion is of a comparatively long configuration as compared to the second inclined portion. The second inclined portion serves for pushing the first inclined portion, so to speak. The angular position of the two inclined portions and their length ratios determine, inter alia, the movement stroke experienced by the element to be moved when the piezo actuator changes with regard to its length. The support of the piezo driver with respect to a fixed point is realized on the piezo actuator which to this end is adapted to be supported on a supporting element.

According to another advantageous embodiment of the invention it is provided that the conversion gear comprises a second bracket which is of the same or essentially the same configuration as the first bracket, wherein the lengths of the first inclined portions of the two brackets are different or the same or essentially the same, and the lengths of the second inclined portions of the two brackets are different or the same or essentially the same. Both the movement stroke and the force at which the movement along the stroke is performed are increased due to the double-bracket configuration of the conversion gear of this variant of the invention. The two brackets are of an identical configuration in that they both respectively comprise two end portions and a first and a second inclined portion between their two respective end portions. The lengths and angular positions of the inclined portions of the one bracket can differ from those of the other bracket. However, it is advantageous to configure the two brackets in the same manner.

In a double-bracket configuration of the conversion gear is it advantageous when the first inclined portion of one of the two brackets is mechanically operatively connected to an element to be moved, and when the first inclined portion of the other one of the two brackets is adapted to be mechanically coupled to a supporting element for supporting the conversion gear.

In the configuration described above of the conversion gear the two brackets can be arranged such that they are concurrently or counterconcurrently aligned on both sides of the effective axis of the piezo actuator. In the first case, the two first inclined portions and the two second inclined portions of the two brackets are arranged in pairs opposite each other. The two pairs are located side by side along the effective axis of the piezo actuator. The inclined portions of the two brackets essentially form a rhombus. When the two brackets are arranged such that they are counterconcurrently aligned on both sides of the piezo actuator, the first inclined portion of the one bracket is respectively located opposite the second inclined portion of the other bracket such that they form pairs. These two pairs respectively composed of a first inclined portion of the one bracket and a second inclined portion of the other bracket are now located side by side along the effective axis of the piezo actuator. Thus, the first and the second inclined portion of the two brackets are arranged like the sides of a parallelogram.

As already stated above, the two inclined portions of the at least one bracket or of each bracket of the conversion gear have different lengths. For example, it is advantageous when the first inclined portion of the at least one bracket or of each bracket of the conversion gear is at least 1.5 times the length or at least 2 times the length or at least 2.5 times the length or at least 3 times the length of the second inclined portion thereof.

The first inclined portions of the two brackets can be of equal length, and the same can apply to the second inclined portions of the two brackets.

As already stated above, metal is selected as the material for the brackets of the conversion gear. Alternatively, a plastic material is also suitable. It is crucial that the materials used for the brackets can offer the function of flexure hinges at the connections of the two first portions to the two inclined portions and between the two inclined portions. A flexure hinge can be configured as a living hinge or, generally speaking, a thinning of the thickness of the bracket, for example. Alternatively, the bracket can also comprise end and inclined portions which are articulated to each other. In any case, the bracket or each bracket is adapted to be elastically deformed which is in particular realized by a corresponding configuration or by a corresponding material selection with regard to the deformation zones of the bracket. However, the individual portions of the or of each bracket can also be movably coupled via pivot hinges.

According to another advantageous embodiment of the invention, the end portions of the at least one bracket or of each bracket can be mechanically connected to the piezo actuator by means of an adhesive or by means of connecting elements. For instance, a screw, a bolt or the like, for example, can be used as a mechanical connecting element.

According to another advantageous embodiment of the invention, it can be provided that the piezo actuator comprises one or a plurality of piezoelectric elements which are stacked one above the other. The stacking order can be realized in the longitudinal extension of the piezo actuator or orthogonally to the latter.

Figure 2:
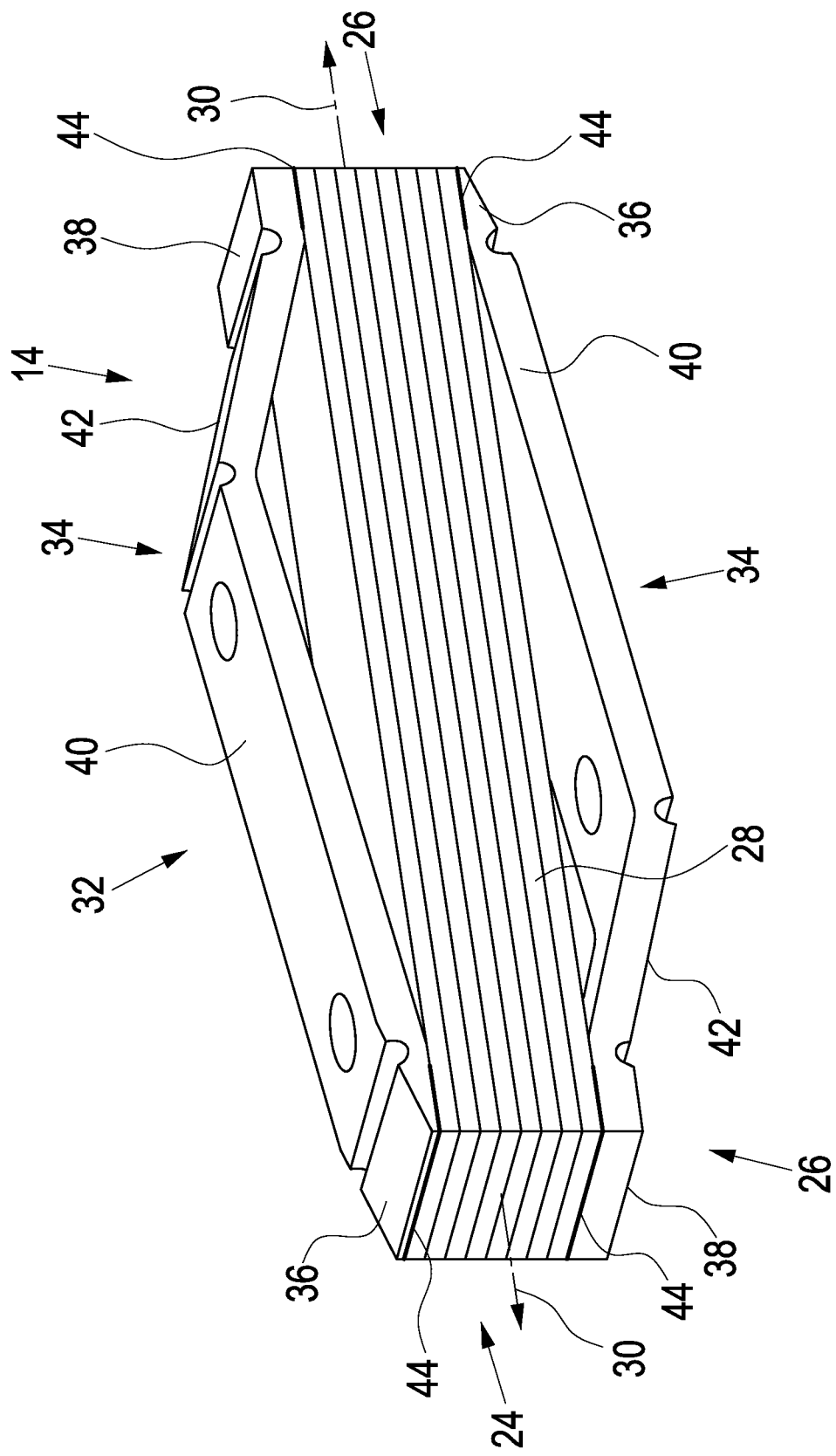

Hereunder the invention will be explained in detail on the basis of an exemplary embodiment with reference to the drawing in which:

FIG. 1 shows a schematic front view of a vehicle operating unit having a touch pad or a touch screen, which is excited in a pulsed manner by a piezo driver for generating a haptic feedback and thus tactile feedback of a manual touch entry, and FIG. 2 shows a perspective view of the piezo driver as used in the vehicle operating unit of FIG. 1.

In FIG. 1 a front view of an operating unit 10 for a vehicle is shown, where the operating element 12 is configured as a touch screen or a touch pad via which a valid operating command entry is tactilely fed back by a pulsed mechanical excitation (haptic feedback). For this purpose, the operating unit 10 comprises a piezo driver 14 which is arranged and effective between the housing wall 16 of the housing 18 of the operating unit 10 and the operating element 12 thereof. Besides the operating element 12 with touch-sensitive entry option, the operating unit 10 can comprise other operating elements, such as keys 20 and/or a rotary controller 22, for example.

FIG. 2 shows a perspective view of an enlarged representation of the piezo driver 14. The piezo driver 14 comprises a piezo actuator 24 which is configured as a strand-shaped, in this embodiment rod-shaped, element with a longitudinal extension which defines its effective direction. The piezo actuator 24 comprises two opposite longitudinal extension ends 26 and is configured as a stack of respective strip-shaped piezoelectric elements in this exemplary embodiment. When an electric voltage is applied to the piezoelectric elements 28 the piezo actuator 24 expands orthogonally to its longitudinal extension (or contracts in this direction depending on the polarity of the applied voltage), which means that it contracts in the longitudinal extension (or expands depending on the polarity of the aforementioned voltage). In this exemplary embodiment, the effective direction 30 of the piezo actuator 24 is thus defined by its longitudinal extension.

On both sides of the piezo actuator 24 or on both sides of the effective direction 30 a conversion gear 32 is located which comprises two metal brackets 34 in this exemplary embodiment. Each metal bracket comprises two end portions 36, 38, wherein between the two end portions 36, 38 two oblique portions, i.e. two inclined portions 40, 42, are arranged. The two inclined portions 40, 42 are flexibly connected to each other, which is realized by a flexure hinge configured by reduction of the thickness of the metal bracket 34 in this exemplary embodiment. One of the two inclined portions, namely the first inclined portion 40, is longer than the other inclined portion, i.e. longer than the second inclined portion 42. The first inclined portion 40 is flexibly connected to the first end portion 36, while the second inclined portion 42 is flexibly connected to the second end portion 38 of the bracket 34. The end portions 36, 38 of the two brackets 34 are connected in a shear-resistant manner to the ends 26 of the piezo actuator 24 by means of an adhesive 44.

The kinematics of the piezo driver 14 functions as follows. When the piezo actuator 24 is correspondingly driven, it becomes shorter in the longitudinal extension, i.e. in its effective direction 30, which means that the two brackets 34 are erected, i.e. moved to the outside, or upwards or downwards relative to the representation of FIG. 2. When electrical driving of the piezo actuator 24 is selected such that the piezo actuator expands in the longitudinal extension, the brackets 34 move towards the piezo actuator 24, i.e. they assume a flat shape. The movement stroke realized in both cases is now utilized to temporarily mechanically excite the operating element 12 in the application as per FIG. 1. For this purpose, the operating element 12 is connected to the longer first inclined portion 40 of one of the two brackets 34, while the conversion gear 32 is supported on the housing wall 16 via the longer first inclined portion 40 of the other bracket 34. The relatively long first inclined portions 40 of the brackets 34 allow for largely inhibiting tilting movements during mechanical excitation of the operating element 12.

For converting the length change of the piezo actuator 24 into a movement stroke for the operating element 12, the two longer first inclined portions 40 of the two brackets 34 serve as force-transmitting elements, while the shorter second inclined portions 42 serve as supporting elements for these force-transmitting elements.

As can be seen in FIG. 2 and also FIG. 1, the two brackets 34 are of essentially the same configuration but arranged in a counterconcurrent manner. Thus the four inclined portions 40, 42 form the sides of a parallelogram, so to speak (when viewing the piezo driver 14 from the side).

FIG. 2 further shows that the first end portions 36 of the two brackets 34 are beveled. This is done because the components (operating element 12 and housing wall 16 in the exemplary embodiment of FIG. 1) abutting on the first inclined portions 40 are exposed in the area of the (first) end portions 36 and do not contact them when the brackets 34 are erected to a maximum extent. Alternatively, the two components can comprise protrusion areas (see FIG. 1) inside which they protrude beyond their sides facing the brackets 34, whereby the end portions 36 do no longer collide with the components.

The reduction of the number of bending zones to the three flexible (i.e. articulated) connections per bracket 34 allows for the first inclined portions 40 of the two brackets 34 realizing the contact with the operating element 12 on the one hand and the support on the housing wall 16 on the other hand to be obliquely arranged in the space or the piezo actuator 24 to be obliquely arranged relative to the aforementioned components. Thereby, the robustness of the piezo actuator and the piezo driver, respectively, can be considerably increased since an unwanted "over-bending" and, consequently, a mechanical failure of the hinges becomes improbable. In addition, the efficiency of the piezo driver increases since each hinge would cause mechanical losses. Thus, the smaller the number of hinges, the higher is the efficiency since the mechanical losses are reduced.

LIST OF REFERENCE NUMERALS

10 Operating unit
12 Operating element
14 Piezo driver
16 Housing wall
18 Housing
20 Keys
22 Rotary controller
24 Piezo actuator
26 Longitudinal extension ends of the piezo actuator
28 Piezoelectric element
30 Effective direction of the piezo actuator
32 Conversion gear
34 Bracket
36 First end portion of a bracket
38 Second end portion of a bracket
40 First inclined portion of a first bracket
42 Second inclined portion of a bracket
44 Adhesive

The invention claimed is:

1. A vehicle operating unit with tactile feedback upon manual actuation, comprising:
a housing,
an operating element which is adapted to be manually actuated, and a piezo driver for pulsed mechanical excitation of the operating element,
wherein the piezo driver is arranged between a housing wall of the housing and the operating element and provided with
a piezo actuator made from a piezoelectric material, wherein the piezo actuator is of a strand-shaped configuration and has a longitudinal extension between two ends and wherein the longitudinal extension of the piezo actuator defines an effective direction of the piezo actuator along which the piezo actuator expands and/or contracts when being driven, and
a conversion gear mechanically coupled to the two ends of the longitudinal extension of the piezo actuator for converting a length change of the piezo actuator occurring in the effective direction of the piezo actuator into a movement of the operating element, which is coupled to the conversion gear and to be moved, at an angle not equal to 0 degree relative to the longitudinal extension of the piezo actuator,
wherein the conversion gear comprises a first bracket which is of an elastic configuration and/or comprises an elastic material and, in the area of the two ends of the longitudinal extension of the piezo actuator, is mechanically coupled to the piezo actuator,
wherein the first bracket comprises a first end portion and a second end portion, within which the first bracket is respectively mechanically coupled to the piezo actuator, and between the first and second end portions an oblique first inclined portion and an oblique second inclined portion, that is shorter as compared to the first inclined portion, which extend like the sides of a triangle with an imaginary connecting line extending between the first and second end portions of the first bracket as a basis and are connected to each other, in particular elastically connected to each other, and where the oblique first inclined portion is connected, in particular elastically connected, to the first end portion and the oblique second inclined portion is connected, in particular elastically connected, to the second end portion, and
wherein the first bracket is coupled to the operating element and the piezo actuator is coupled to the housing wall, or the first bracket is coupled to the housing wall and the piezo actuator is coupled to the operating element.

2. The vehicle operating unit according to claim 1, wherein the oblique first inclined portion of the first bracket of the conversion gear is adapted to be mechanically operatively connected to the operating element and the piezo actuator is adapted to be supported on the housing wall, or wherein the oblique first inclined portion of the first bracket of the conversion gear is adapted to be mechanically operatively connected to the housing wall and the piezo actuator is adapted to be supported on the operating element.

3. The vehicle operating unit according to claim 1, wherein the conversion gear comprises a second bracket which is of the same or essentially the same configuration as the first bracket of the conversion gear, wherein the lengths of the oblique first inclined portions of the first and second brackets are different or the same or essentially the same and the lengths of the oblique second inclined portions of the first and second brackets are different or the same or essentially the same.

4. The vehicle operating unit according to claim 3, wherein the oblique first inclined portion of one of the first and second brackets of the conversion gear is adapted to be mechanically operatively connected to the operating element and wherein the oblique first inclined portion of the other one of the first and second brackets of the conversion gear is adapted to be mechanically coupled to the housing wall instead of to a supporting element for supporting the conversion gear.

5. The vehicle operating unit according to claim 3, wherein the first and second brackets of the conversion gear are arranged such that they are concurrently aligned on both sides of the piezo actuator, wherein the two oblique first inclined portions and the two oblique second inclined portions are arranged in two pairs opposite each other and the two pairs are arranged side by side along the effective direction of the piezo actuator.

6. The vehicle operating unit according to claim 3, wherein the first and second brackets of the conversion gear are arranged such that they are counterconcurrently aligned on both sides of the piezo actuator, wherein the oblique first inclined portion of the one bracket is respectively arranged opposite the oblique second inclined portion of the other bracket such that they form pairs and the two pairs are arranged side by side along the effective direction of the piezo actuator.

7. The vehicle operating unit according to claim 1, wherein the oblique first inclined portion of the first bracket of the conversion gear has at least 1.5 times the length or at least 2 times the length or at least 2.5 time the length or at least 3 times the length of the oblique second inclined portion thereof.

8. The vehicle operating unit according to claim 3, wherein the oblique first inclined portions of the first and second brackets of the conversion gear have the same length, and/or wherein the oblique second inclined portions of the first and second brackets have the same length.

9. The vehicle operating unit according to claim 1, wherein the first bracket of the conversion gear comprises metal or a plastic material.

10. The vehicle operating unit according to claim 1, wherein per bracket of the conversion gear the first and second end portions are articulated to the respective inclined portion and the oblique first and second inclined portions are articulated to each other.

11. The vehicle operating unit according to claim 1, wherein the first and second end portions of the first bracket of the conversion gear are mechanically connected to the piezo actuator either by means of an adhesive or by means of a connecting element.

* * * * *